(12) United States Patent
Bauer et al.

(10) Patent No.: US 12,009,805 B2
(45) Date of Patent: Jun. 11, 2024

(54) DMS FILTER, ELECTROACOUSTIC FILTER AND MULTIPLEXER

(71) Applicant: RF360 SINGAPORE PTE. LTD, Singapore (SG)

(72) Inventors: Thomas Bauer, Munich (DE); Ansgar Schäufele, Munich (DE); Thomas Dengler, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 286 days.

(21) Appl. No.: 17/434,362

(22) PCT Filed: Mar. 16, 2020

(86) PCT No.: PCT/EP2020/057021
§ 371 (c)(1),
(2) Date: Aug. 26, 2021

(87) PCT Pub. No.: WO2020/187811
PCT Pub. Date: Sep. 24, 2020

(65) Prior Publication Data
US 2022/0103161 A1 Mar. 31, 2022

(30) Foreign Application Priority Data
Mar. 19, 2019 (DE) .............. 10 2019 107 010.4

(51) Int. Cl.
*H03H 9/64* (2006.01)
*H03H 9/02* (2006.01)
*H03H 9/145* (2006.01)

(52) U.S. Cl.
CPC ...... *H03H 9/6453* (2013.01); *H03H 9/02637* (2013.01); *H03H 9/02834* (2013.01); *H03H 9/14541* (2013.01)

(58) Field of Classification Search
None
See application file for complete search history.

(56) References Cited

U.S. PATENT DOCUMENTS 4,910,839 A * 3/1990 Wright ............... H03H 9/14505
29/25.35
9,130,538 B2 9/2015 Bauer et al.
(Continued)

FOREIGN PATENT DOCUMENTS

| DE | 102016123701.9 | 6/2018 |
| JP | H0491508 A | 3/1992 |
| WO | 2011144664 | 11/2011 |

OTHER PUBLICATIONS

International Search Report and Written Opinion—PCT/EP2020/057021—ISA/EPO—dated Jun. 4, 2020.

*Primary Examiner* — Kenneth B Wells
(74) *Attorney, Agent, or Firm* — Polsinelli

(57) ABSTRACT

An improved DMS filter with electrode structures between a first port and a second port is provided. Wiring junctions are realized in multilayer crossing with dielectric material in between. There are insulating patches (L2) between crossing conductor layers (L1,L3). Signal wirings may be realized with multiple conductor layers (L1, L3) to reduce wiring resistance and the upper conductor layer (L3) of the signal wiring may partly overlap the insulating patches (L2). The insulating patches (L2) may extend over the acoustic path to achieve temperature compensation.

23 Claims, 5 Drawing Sheets

AA of Fig. 5

(56) References Cited

U.S. PATENT DOCUMENTS

| | | |
|---|---|---|
| 2007/0018756 A1 | 1/2007 | Fujii et al. |
| 2008/0204167 A1 | 8/2008 | Takamine |
| 2012/0098618 A1 | 4/2012 | Tanaka |
| 2012/0105298 A1 | 5/2012 | Inoue et al. |
| 2014/0118088 A1* | 5/2014 | Burak ................ H03H 9/02118 333/187 |
| 2016/0126932 A1* | 5/2016 | Nakai .................. H03H 9/6483 333/133 |
| 2016/0173060 A1 | 6/2016 | Hatakeyama et al. |
| 2018/0123556 A1 | 5/2018 | Takamine |
| 2019/0089333 A1* | 3/2019 | Dengler ............... H03H 9/0052 |

* cited by examiner

AA of Fig. 5

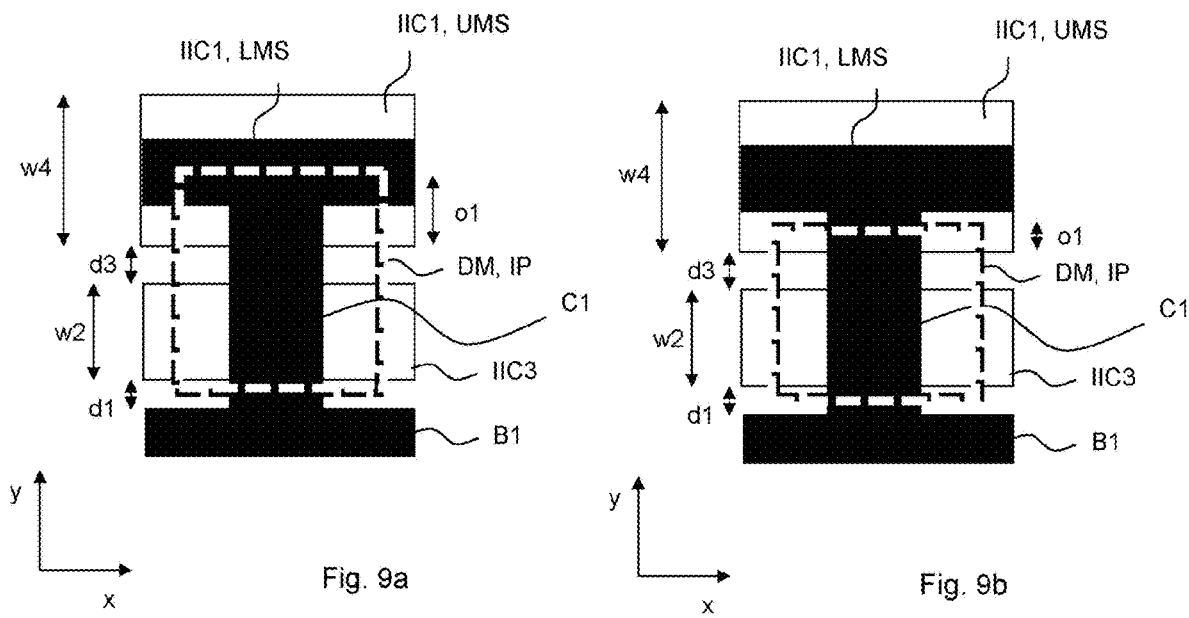
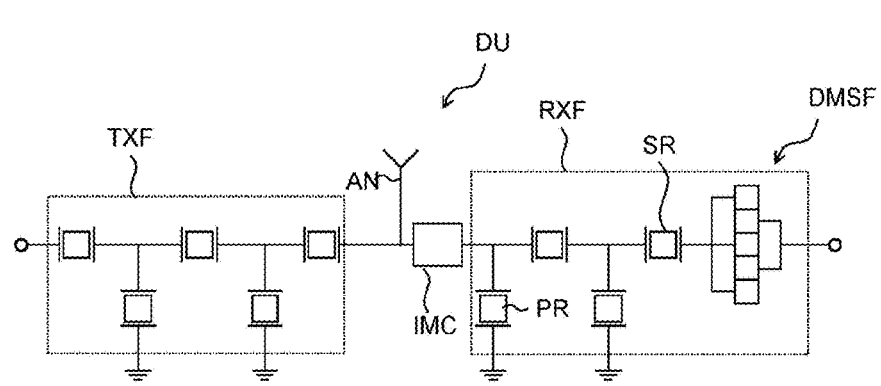
Fig. 10

DMS FILTER, ELECTROACOUSTIC FILTER AND MULTIPLEXER

The present Application for Patent is a 371 of international Patent Application PCT/EP2020/057021, filed Mar. 16, 2020, which claims priority Germany Patent Application 102019107010.4, filed Mar. 19, 2019, which is hereby incorporated by referenced in its entirety and for all purposes.

The present application refers to improved DMS filters and to electroacoustic filters and multiplexers comprising such DMS filters.

Mobile communication devices need RF filters to distinguish wanted RF signals from unwanted RF signals. Corresponding RF filters can comprise electroacoustic components such as electroacoustic resonators and DMS filters (DMS=dual mode SAW; SAW=surface acoustic wave). A DMS filter comprises one or more input IDTs and one or more output IDTs (IDT=interdigital transducer). The IDTs are arranged between electroacoustic reflectors. There are DMS filters that work with surface acoustic waves (SAW=surface acoustic wave). To that end, the transducers have an electrode structure coupled to a piezoelectric material. Due to the piezoelectric effect, such an electrode structure together with a piezoelectric material converts between electromagnetic RF signals and acoustic RF signals. Input transducers usually receive electromagnetic RF signals from an external circuit environment, e.g. from an antenna, and provide accordingly filtered electromagnetic RF signals at the output transducers, which are typically connected with an output port to an external circuit environment, e.g. a low noise amplifier of a mobile communication device.

Such a DMS filter can be included with other circuit elements, e.g. other filter elements, in an RF filter of the mobile communication device. The performance of such a filter depends, e.g., on the electrical losses and the acoustic losses of the filter structures. Also, characteristic frequencies of an RF filter should not be subject to a temperature-induced frequency drift. Further, a corresponding RF filter should comply with specifications concerning impedance matching, bandwidth and selection level. Further, corresponding RF filters should be producible with low manufacturing costs and comply with the current trend towards miniaturization.

To that end, a DMS filter according to the independent claim is provided. Dependent claims provide preferred embodiments.

The DMS filter comprises a first port and a second port.

It is possible that the DMS filter is an 11-IDT DMS filter. Of the eleven IDTs, six IDTs can be first IDTs and five IDTs can be second IDTs. Further, the DMS filter can have a first acoustic reflector and a second acoustic reflector. All eleven IDTs can be arranged between the first and the second acoustic reflector. The first IDTs can be electrically connected to the first port. The second IDTs can be electrically connected to the second port.

Further, it is possible that the DMS filter comprises a piezoelectric material. Additionally, the DMS filter can have an electrode structure arranged above or on the piezoelectric material. The electrode structure can be electrically connected between the first port and the second port.

It is possible that the electrode structure has a multilayer construction. Then, it is possible that the multilayer construction comprises metal and a dielectric material.

The six first IDTs and the five second IDTs can be parts of the electrode structure. Thus, the IDTs can be electrically connected between the first port and the second port. Specifically, the first IDTs and the second IDTs can be acoustically coupled. Thus, the two acoustic reflectors together with the eleven IDTs establish the acoustically active elements of the DMS filter.

The number of IDTs is not specifically limited to eleven. The DMS filter can have more than eleven or less than eleven IDTs. However, an 11-IDT DMS filter appears to provide a good trade-off between performance and area needed for the filter's structures.

An 11-IDT DMS filter has electrical losses that differ from that of an n-IDT DMS filter by a factor of approximately $(1-(n/11)*(n/11))$. One term $(n/11)$ is due to the changed number of fingers (when the overall impedance should be maintained). The other term $(n/11)$ is due to the corresponding finger length. Thus, as an example, when compared to a 9-IDT DMS filter the electrical losses are reduces by a factor of 0.33.

Via the first port and the second port, respectively, the DMS filter can be electrically connected to an external circuit environment. The DMS filter can be coupled with other filter elements such as passive impedance elements or other electroacoustic resonators to establish a more complex electroacoustic RF filter.

Specifically, it is possible that the DMS filter can be electrically connected in series to a ladder-type like circuit topology to provide an electroacoustic filter with excellent filter performance and with a high power durability. Such a filter can be a reception filter of a mobile communication device.

The electrode structure of the DMS filter can be arranged directly on the piezoelectric material. However, it is possible that one or more sublayers are arranged between the electrode structure and the piezoelectric material.

By providing the electrode structure as a multilayer construction and by providing the multilayer construction with metal and dielectric material an improved signal conduction in the structures of the DMS filter can be obtained. To that end, the dielectric material and the metal are arranged relative to one another so that electric losses such as capacitive losses or ohmic losses are reduced. Additionally, by configuring a DMS filter according to the disclosure of this invention, the necessary chip area can be minimized, reducing cost and helping to miniaturize the size. Further, parasitic capacitances can be reduced and possible filter bandwidths can be increased. Correspondingly, it is possible that the DMS filter establishes a bandpass filter or a band rejection filter.

The IDTs of the DMS filter can comprise busbars and electrode fingers. Each electrode finger is electrically connected to one of the two busbars of an IDT. When adjacent electrode fingers are connected to opposite busbars then an acoustic excitation center is placed between the two electrode fingers. The electrode fingers extend in a direction essentially perpendicular to the direction of propagation of surface acoustic waves. Further, the electrode fingers have an extension along a direction orthogonal to the normal direction of the piezoelectric material.

Such a DMS filter provides reduced electric and parasitic losses while the needed chip area is reduced. Thus, such a DMS filter is compatible with the ongoing trend towards miniaturization and the filter's layer construction is compatible with conventional layer deposition and structuring techniques.

The IDTs which can be first IDTs and second IDTs, respectively, can be arranged between the two acoustic reflectors to confine the acoustic energy to the active area of the resonator to increase the quality factor Q of the DMS structure and to reduce losses. A corresponding bandpass filter has a reduced insertion loss within the passband.

It is possible that the DMS filter comprises a first inter IDT connection and a second inter IDT connection. Each IDT can have a first busbar and a second busbar. The first busbars of the first IDTs can be electrically connected to one another via the first inter IDT connections. The second busbars of the second IDTs can be electrically connected via the second inter IDT connection.

Thus, relative to the first inter IDT connection and to the second inter IDT connection, IDTs are electrically connected in parallel. The opposing busbars are typically grounded.

Specifically, it is possible that first busbars of the first IDTs are electrically connected to the first port and the second busbars of second IDTs are electrically connected to the second port.

It is possible that—from a perspective of an RF signal—the DMS filter structure is entered via the first port as an input port. Via the first inter IDT connection the RF signal is separated into several sub-signals that enter via their corresponding first busbar, establishing the input of a first IDT, the first IDTs. The second busbars of the first IDTs can be electrically connected to a ground potential. Within the first IDTs the energy of the sub-signals excite acoustic waves that propagate to the second IDTs. First busbars of the second IDTs can be electrically connected to a ground potential. All second busbars of the second IDTs establish the output means of the second IDTs. In the second IDTs acoustic energy is converted into electromagnetic energy that is provided to the second inter IDT connection. The second inter IDT connection can be electrically connected or coupled to the second port which can be the output port of the DMS filter.

It is possible that the first and the second inter IDT connections comprise a lower metal strip and an upper metal strip.

The lower metal strip and the upper metal strip can be strips arranged in different layers of the multilayer construction of the electrode structure. The provision of the electrode structure as a multilayer construction allows to select materials for the different layers, e.g. for the layer comprising the lower metal strip and for the layer comprising the upper metal strip according to different requirements. Material layers being in closer proximity to the piezoelectric material can be chosen according to their acoustic, i.e. electromechanical, properties. Materials of layers being further away from the piezoelectric material can be chosen according to their electrical properties.

Thus, the lower metal strip can comprise a metal or a layered construction that provides a good resistance against delamination and/or electro-acoustic migration, with a layer height which is optimized for the electro-acoustic coupling and reflectivity. Typically, resulting layer heights are low and imply higher electric resistance. Metal or material layer systems of the upper metal strip can be chosen to provide a low resistivity and a higher layer height.

Thus, the lower metal strip can comprise or consist of copper, aluminum, titanium, chrome, silver, gold and other suitable materials.

The upper metal strip can comprise or consist of silver, gold, aluminum, copper, titanium and other suitable materials.

It is possible that the DMS filter further comprises a third inter IDT connection and a fourth inter IDT connection. Each of the third inter IDT connection and the fourth inter IDT connection can comprise an inner metal strip.

The phrase "inner" is relative to the central excitation area and the lateral direction (y) perpendicular to the direction of propagation of the surface wave.

Specifically, with respect to the element's footprints, the inner metal strips can be arranged between the lower metal strips and/or the upper metal strips with respect to a transversal direction.

In contrast, the terms "lower" and "upper" refer to their corresponding vertical position (z).

While the first and the second inter IDT connections, especially the upper metal strips, reduce the resistance at the first port and at the second port, respectively, the third inter IDT connection and the fourth inter IDT connection can help reduce the resistance of the electrode structure when a ground connection is concerned.

It is possible that the third inter IDT connection electrically connects the ground connections of the second IDTs and the fourth inter IDT connection electrically connects the ground connections of the first IDTs to reduce their resistance to ground.

Correspondingly, the lower metal strip, the upper metal strips and the inner metal strips can be strip-shaped patches extending along the longitudinal direction and being arranged—in a transversal direction—between the central excitation area and the corresponding first or second port. The length of the metal strips can essentially equal the length of the active area between the acoustic reflectors.

The inner metal strips can be longer than the lower metal strips and the upper metal strips. The second inter IDT connection and their corresponding metal strips can be shorter than that of the first inter IDT connection.

Correspondingly, it is possible that the third inter IDT connection electrically connects the first busbars of the second transducers and the fourth inter IDT connection electrically connects the second busbars of the first transducers such that a reduced resistance to the ground potential is obtained.

It is possible that the DMS filter further comprises insulating patches. The filter can comprise insulating patches between the third inter IDT connection and the first connections C1 and further insulating patches between the fourth inter IDT connection and the second connections C2.

At least a part of the material of the insulating patches can be in the multilayer construction in a vertical position between the third inter IDT connection and the first connections. The fourth inter IDT connection can be at the same vertical level as the third inter IDT connection and the second inter IDT connection can be at the same vertical level as the first inter IDT connection.

The elements of the inter IDT connections can have a—in the vertical direction—thickness of $0.08\ \mu m \leq t \leq 0.5\ \mu m$, e.g. $0.15\ \mu m$, for the lower stripss and a thickness of $0.7\ \mu m \leq t \leq 3\ \mu m$, e.g. $2.5\ \mu m$, for the upper and inner strips.

The insulating patches can have a—in the vertical direction—thickness of $0.5\ \mu m \leq t \leq 1.5\ \mu m$, e.g. $0.87\ \mu m$.

The insulating patches together with the inter IDT connections establish conductor crossings. The positioning and size of the corresponding strips according to the present invention allows a strong reduction of parasitic capacitances while the total conductor lengths of the structures within the DMS filter is kept short such that ohmic losses are kept at a minimum, too.

The insulating patches preferably consist of the dielectric material of the multilayer construction of the electrode structure. The dielectric material can be chosen according to its dielectric properties such as its dielectric constant and dielectric loss. However, due to the dual nature of electroacoustic filters which are electrically active and acoustically active, the mechanical properties of the dielectric material can also be used to augment a waveguiding in the filters' structures.

The insulating patches can also be used to enhance a further property of the DMS filter. The material of the dielectric patches can also be used to reduce temperature-induced drifts of characteristic frequencies, if applied close to or directly above the electrode fingers. Characteristic frequencies can be a center frequency of a passband or the frequency of the left or of the right passband skirt.

To that end, the dielectric material, e.g. of the insulating patches, can be a material which counteracts a temperature-induced frequency drift of a carrier substrate or of the piezoelectric material.

In addition to the insulating patches a further TCF (Temperature Coefficient of Frequency) compensation layer can be arranged above and/or below the electrode structure or below the piezoelectric material.

Further, it is possible that each second IDT is arranged between two first IDTs in a linear arrangement.

The linear arrangement refers to the IDTs together with the acoustic reflectors such that the IDTs are arranged along a straight line. A transversal offset of an IDT relative to other IDTs can be essentially zero.

The extension of the linear arrangement essentially coincides with the propagation of direction of the acoustic waves parallel to the x direction.

It is also possible that the electrode fingers are placed along a straight line which is slanted at a determined slanting angle against the acoustic propagation direction.

Also, it is possible that the footprint of the IDTs has a symmetry with respect to a symmetry line perpendicular to a direction of SAW propagation.

Specifically, the symmetry line is essentially parallel to the extension of the electrode fingers. In the case of an 11-IDT DMS filter the symmetry line is within the center of the second IDTs.

The symmetry mentioned above is valid when the structures of the DMS filter are projected to the surface of the piezoelectric material establishing the footprint. When the construction along the vertical direction is concerned, then the symmetry line can have a symmetry plane as an equivalent for the symmetry in three dimensions.

The corresponding symmetry plane is then perpendicular to the direction of propagation of the SAW.

Further, when the vertical construction is concerned the multilayer construction can comprise the lower metal strips of the first and of the second inter IDT connections in a first layer. Further, the multilayer construction can comprise the upper metal strips of the first and of the second inter IDT connections in a third layer. Further, the multilayer construction can comprise the insulating patches in a second layer arranged between the first layer and the third layer.

Further, to reduce ohmic losses the third layer can have a higher thickness than the first layer. Thus, a larger cross-section of the conductors is obtained resulting in reduced ohmic losses.

Also, the third inter IDT connection and the fourth inter IDT connection can be connected to a ground potential such that the electrical connection of each IDT to the ground potential is improved.

It is possible that the first IDTs are input IDTs and the second IDTs are output IDTs.

Thus, the first IDTs can be galvanically connected to the first port which can be the input port and the second IDTs can be galvanically connected to the second port which can be the output port.

The DMS filter can further comprise a TC (temperature compensation) structure. The TC structure can be a multilayer TC structure. The multilayer TC structure can comprise a TC material (TC=temperature compensation) below the piezoelectric material, between the piezoelectric material and the electrode structure, between elements of the electrode structure and/or above the electrode structure. Specifically, the multilayer TC structure can comprise a TC material layer above the electrode structure and the insulating patches within the electrode structure. It is advantageous to use TC material also as dielectric material to constitute the insulating patches for forming the line crossings.

Further, it is possible that the DMS filter is a TF-SAW DMS filter (TF=thin film).

In a TF-SAW DMS filter the piezoelectric material is provided as a piezoelectric thin film. The piezoelectric thin film can be a monocrystalline material. However, it is possible that the piezoelectric material is provided as a polycrystalline material.

The piezoelectric thin film material can be provided utilizing thin film layer deposition techniques such as CVD (chemical vapor deposition), PVD (physical vapor deposition), MBE (molecular beam epitaxy), sputtering and the like. Further, techniques such as "smart-cut" techniques or grinding can be used to obtain a thin film of a monocrystalline material.

The piezoelectric material can be aluminum nitride or a scandium-doped aluminum nitride, lithium tantalate, lithium niobate or quartz. When a monocrystalline piezoelectric material is wanted, then lithium tantalate and lithium niobate can be preferred.

It is possible that the upper metal strips (UMS) of the first inter IDT connection (IIC1) and/or the second inter IDT connection (IIC2) overlap the insulating patches (IP) with an overlap width o1.

It is possible that the inner metal strips (IMS) of the third inter IDT connection (IIC3) and/or the fourth inter IDT connections (IIC4) are with full width located on top of the insulating patches (IP).

It is possible that the upper metal strip (UMS) of the first inter IDT connection (IIC1) fully covers the lower metal strip (LMS) of IIC1 and/or that the upper metal strip (UMS) of the second inter IDT connection (IIC2) fully covers the lower metal strip (LMS) of IIC2.

It is possible that the insulating patches (IP) do not overlap the lower metal strips (LMS).

It is possible that the electrode structure does not contain the lower metal strips (LMS).

It is possible that the insulating patches (IP) overlap the first connections (C1) of the first IDTS (IDT1) and the second connections (C2) of the second IDTs (IDT2).

It is possible that the insulating patches (IP) do not overlap with the first busbars (B1) or the second busbars (B2).

Further, it is possible that the DMS filter is part of an electroacoustic filter such as an electroacoustic RF filter, e.g. of a mobile communication device.

Further, it is possible that a corresponding electroacoustic filter is part of a multiplexer, e.g. of a duplexer, a triplexer, a quadplexer or a multiplexer of a higher order.

Specifically, it is possible that the electroacoustic filter is a reception filter of a mobile communication device.

As a reception filter of a mobile communication device, e.g. in a frontend circuit, the electroacoustic filter can be electrically connected between a common port, e.g. a port to an antenna connection, and a low noise amplifier.

The width of the upper metal strips of the first and/or of the second inter IDT connections can be between 10 µm and 25 µm, e.g. 14 µm.

The width of the inner metal strips of the third inter IDT connection and/or of the fourth inter IDT connection can be between 8 µm and 20 µm, e.g. 10 µm. A transversal distance between the first inter IDT connection and the inner metal strip of the third inter IDT connection and between the second inter IDT connection and the inner metal strip of the fourth inter IDT connection, respectively, can be between 3 µm and 10 µm, e.g. 5 µm. The transversal distance between the inner metal strips and the busbars of the IDTs can be between 6 µm and 15 µm, e.g. 11 µm.

The lengths of the IDTs in the longitudinal direction and the widths of the IDTs, specifically the aperture of the IDTs, along the transversal direction and the number of IDTs per DMS filter can be chosen such that specifications concerning impedance matching with other circuit elements of the filter can be complied with.

It is preferred to reduce the IDTs' finger lengths such that the sum of electrical and acoustical losses is minimal.

Compared to a DMS filter with nine IDTs, an 11-IDT filter provides an improved trade-off between area consumption and performance. Additionally, the IDTs can have an increased metallization ratio η≥0.5, an increased thickness of the metal in the vertical direction>150 nm, respectively, an increased cross-section of the fingers to increase conductivity.

The ground/ground connection order at the distal electrode fingers of the IDTs reduces capacitive couplings which increases the wideband selection level of the filter.

The insulating patches can comprise or consist of a silicon oxide, e.g. a silicon dioxide, or an organic material like BCB (BCB=benzocyclobutene).

The filter can further comprise connection pads for electrically connecting the electrode structure to an external circuit environment. Connection pads for connecting the structure to ground potential can comprise two pads that are arranged at opposite sides of the acoustic track, e.g., for a double ground connection. However, it is possible to use only a single connection pad for a connection to ground and to use a corresponding conductor loop from one side of the acoustic track to the respective other side of the acoustic track. The loop can electrically connect the inner metal strips of the DMS filter structure.

Central aspects, working principles and details of preferred embodiments are shown in the accompanying schematic figures.

In the figures:

FIGS. 9a, 9b illustrate distances along a transversal direction in a top view of an enlarged section; and FIG. 10 illustrates the use of the DMS filter in a duplexer.

Figure 1:
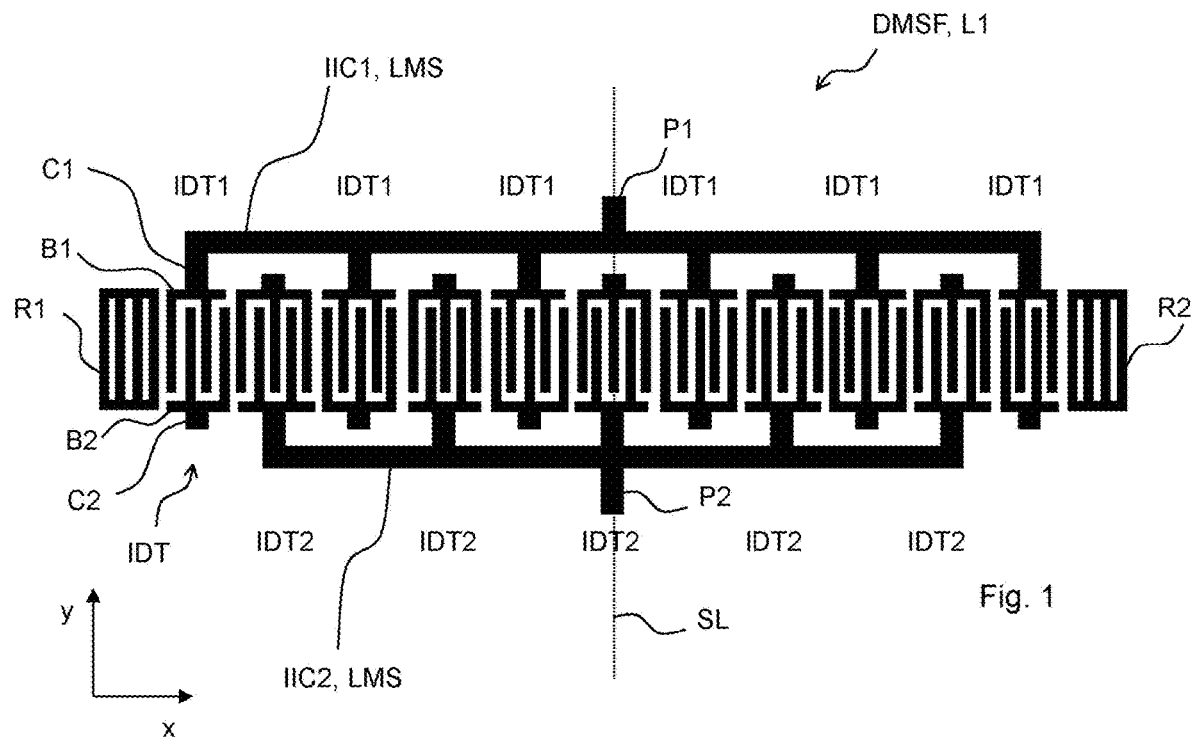
FIG. 1 shows an 11-IDT DMS filter illustrating important elements in form of the first metal layer in a top view.

FIG. 1 illustrates a top view onto central elements of the DMS filter DMSF. The DMS filter DMSF has eleven IDTs. Six IDTs are first IDTs IDT1. Five IDTs are second IDTs IDT2. All IDTs are arranged between a first acoustic reflector R1 and a second acoustic reflector R2. The IDTs and the reflectors establish a linear arrangement defining the acoustic track of the DMS filter. It is possible that each of the second IDTs IDT2 is arranged between two first IDTs IDT1. The distal first IDTs IDT1 are arranged between an acoustic reflector and a second IDT IDT2.

Each of the first IDTs is electrically connected to the first port P1. Each of the second IDTs is electrically connected to the second port P2. Reference potential of both ports can be ground potential. The first IDTs are connected to the first port with their first busbar B1 and first connection C1 (compare FIG. 3). The second IDTs are connected to the second port with their second busbar B2 and second connection C2. The second connections of the first IDTs can be electrically connected to ground potential and the first connections C1 of the second IDTs can also be electrically connected to the ground potential. The two-dimensional footprint of the IDTs and/or of the conductor segments supplying the IDTs with RF signals can have a symmetry with a symmetry line SL extending along the direction of extension of the electrode fingers and penetrating the central second IDT.

When three-dimensional structures are concerned, then the symmetry line SL corresponds to a mirror plane being perpendicular to the direction of propagation of the acoustic waves x. The transversal direction is denoted by y.

Figure 5:
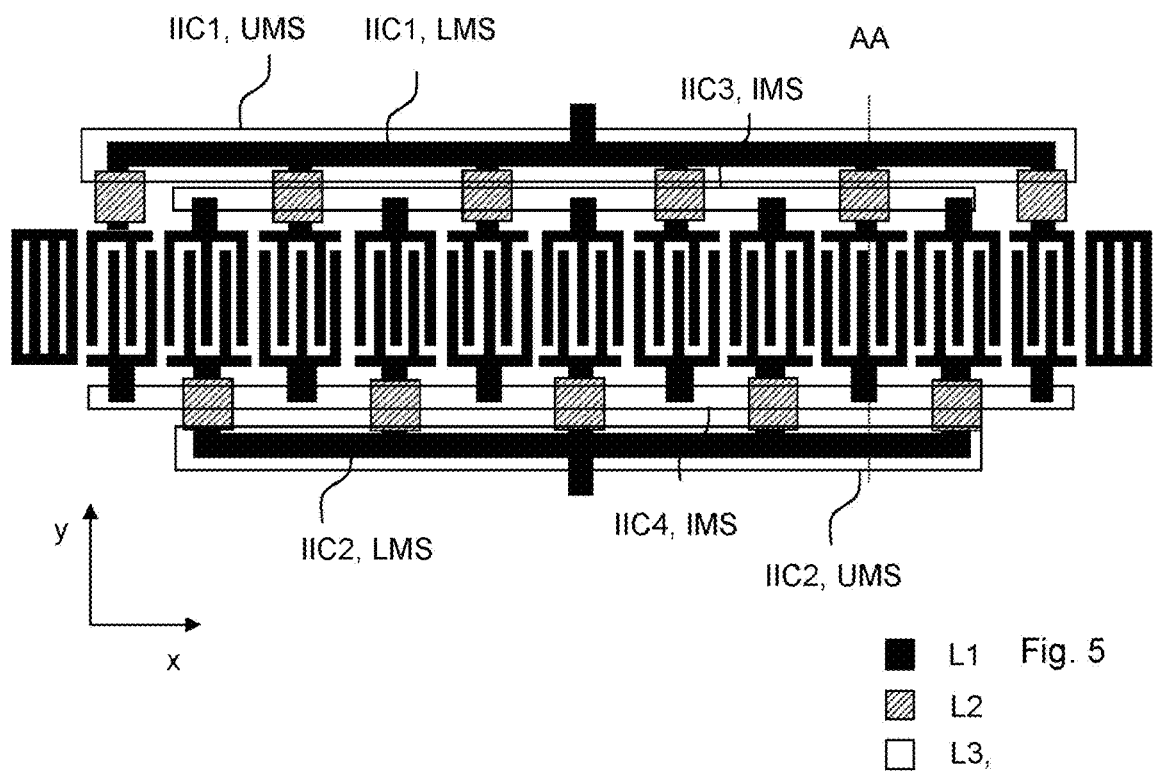
FIG. 5 illustrates the positions of the elements of the first and of the second inter IDT connections and of the third and fourth inter IDT connections.
Figure 8:
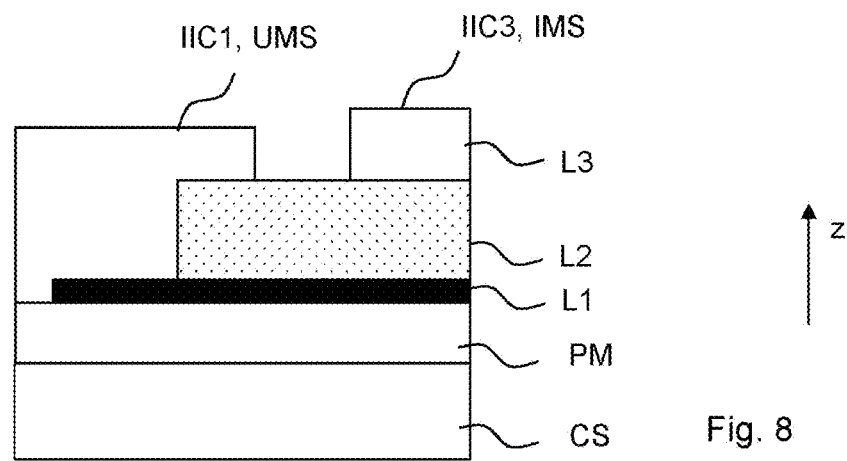
FIG. 8 illustrates the multilayer construction of the electrode structure in an enlarged view of a cross-section.

FIG. 1 shows a possible metal structure of the DMS structure that is established in a first layer L1 of the multilayer construction of the electrode structure (compare FIGS. 5 and 8).

Figure 2:
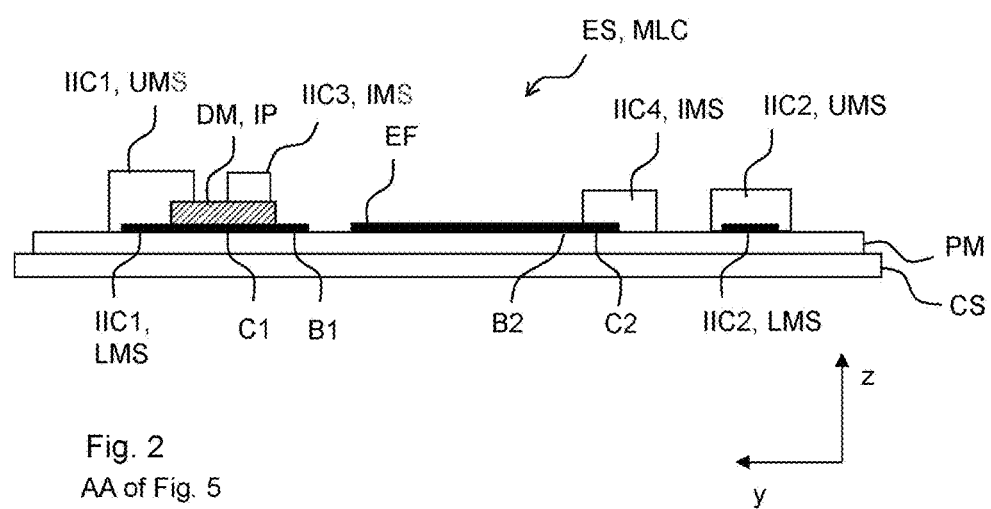
FIG. 2 illustrates a cross-section through an IDT.

FIG. 2 shows a cross-section illustrating the multilayer construction of the electrode structure. Specifically, FIG. 2 illustrates a cross-section AA corresponding to position AA illustrated in FIG. 5. The electrode structure ES is arranged on a piezoelectric material PM. The piezoelectric material PM can be arranged on a carrier substrate CS. The electrode structure ES with its multilayer construction MLC comprises a first inter IDT connection IIC1 and a second inter IDT connection IIC2. The first inter IDT connection IIC1 can have a lower metal strip LMS and an upper metal strip UMS. The second inter IDT connection can have a lower metal strip LMS and an upper metal strip UMS. LMS can be from a first photolithographically created metal layer L1 and UMS can be from a third photolithographically created metal layer L3.

LMS can be omitted to further reduce the size of the MLC, if UMS is present with a sufficiently high electrical conductivity.

Further, the electrode structure ES can have a third inter IDT connection IIC3 and a fourth inter IDT connection IIC4. The first and the second inter IDT connections IIC1, IIC2 can be provided to conduct an RF signal from the first port to the DMS and from the DMS to the second port. The third inter IDT connection and the fourth inter IDT connection IIC3, IIC4 can be provided to enable the connection to the ground potential. To electrically separate the ground connection from the input port and the output port, the dielectric material DM in the form of insulating patches IP is provided in a second dielectric layer L2 between the lower metal conductors C1 and the inner metal strips of the third inter IDT connection IIC3.

To minimize the area consumption and therefore the size of the construction, while minimizing the risk of connection failures of the photolithographically created multilayer structure MLC with inherent misalignment tolerances between the layers, IIC1 UMS partially overlaps the insulating patches IP of the dielectric material DM.

Figure 3:
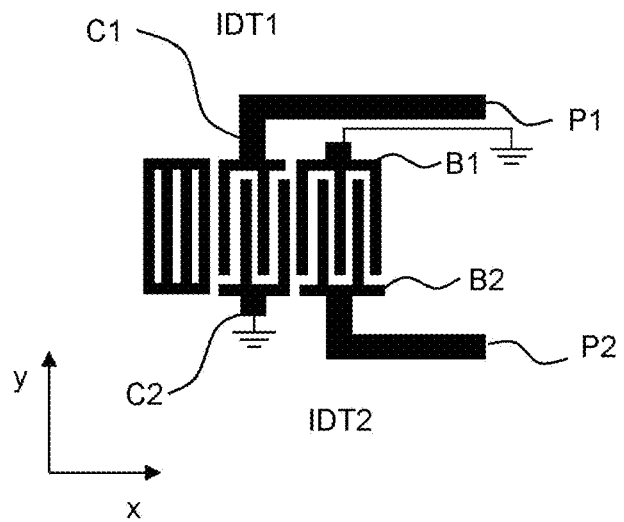
FIG. 3 illustrates the orientation of the IDTs within the acoustic track with respect to the transversal direction y.

FIG. 3 illustrates the orientation of the IDTs, i.e. the location of the first busbars B1 and first connections C1 and of the second busbars B2 and second connections C2 with respect to the locations of the first port and of the second port. The first connections C1 of the first IDTs IDT1 electrically connect the first port P1 and the first busbars B1 of the first IDTs. The second connections C2 of the second IDTs IDT2 electrically connect the second port P2 and the second busbars B2 of the second IDTs. The second connections C2 of the first IDTs IDT1 and the first connections C1 of the second IDTs IDT2 are electrically connected to ground potential.

Figure 4:
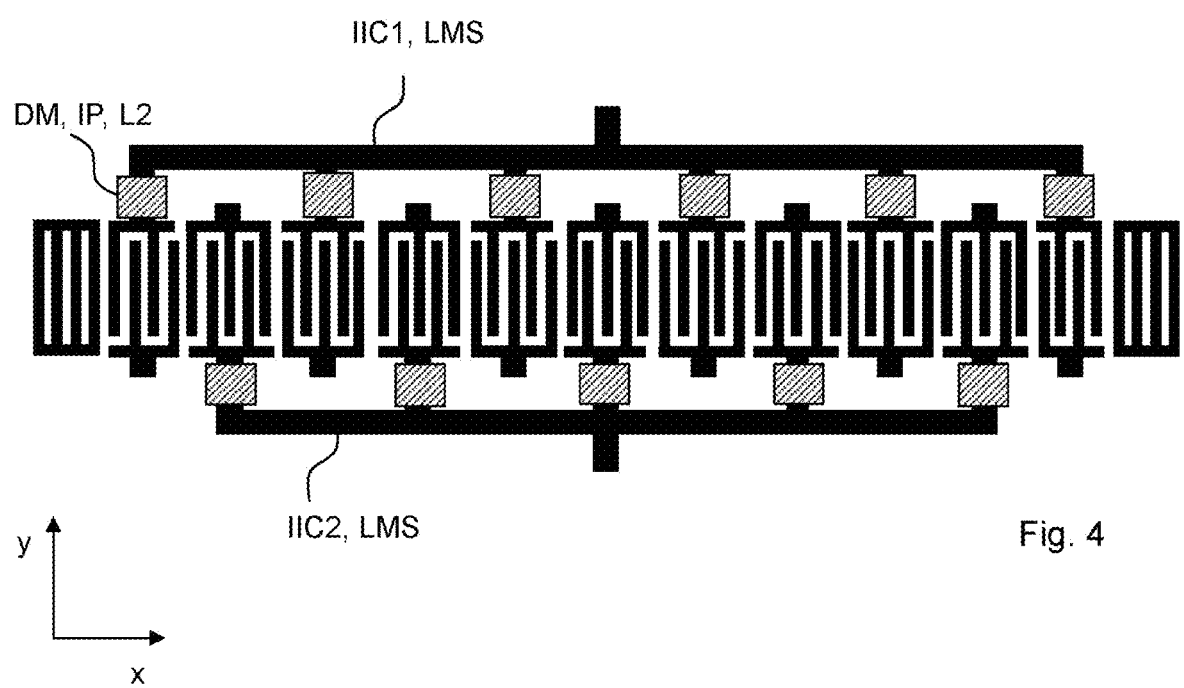
FIG. 4 illustrates the use of a dielectric material to create conductor path crossings.

FIG. 4 illustrates the positions of the insulating patches IP comprising or consisting of the dielectric material DM at the places of conductor crossings to prevent an electrical short circuit between conductors electrically connected to ground and conductors electrically connected to the first or second port, respectively. The insulating patches can be created from a second photolithographic process structuring a second dielectric layer L2. Favorably, for reducing the size, the insulating patches can only overlap the connections C1, C2, but not the busbars B1, B2 and lower metal strips LMS IIC1, IIC2.

Correspondingly, FIG. 5 illustrates the positions of the inner metal strips IMS of the third inter IDT connection IIC3 and of the fourth inter IDT connection IIC4. Further, the positions of the lower metal strips LMS and upper metal strips UMS of the first and of the second inter IDT connections IIC1, IIC2 are also shown.

IIC1 UMS, IIC2 UMS, IIC3 IMS and IIC4 IMS can be created in a third photolithographic process structuring a third metal layer L3. Typically, L3 comprises a thick, well conducting metal layer to minimize ohmic resistance losses.

The lateral positions (y) of the lower metal strips and of the upper metal strips of an inter IDT connection IIC essentially coincide. However, it is possible that the inner metal strips and the upper metal strips are arranged at the same vertical level and consist of material of the same layer L3, which simplifies the manufacturing steps.

Position AA illustrates the location of the cross-section shown in FIG. 2.

Figure 6:
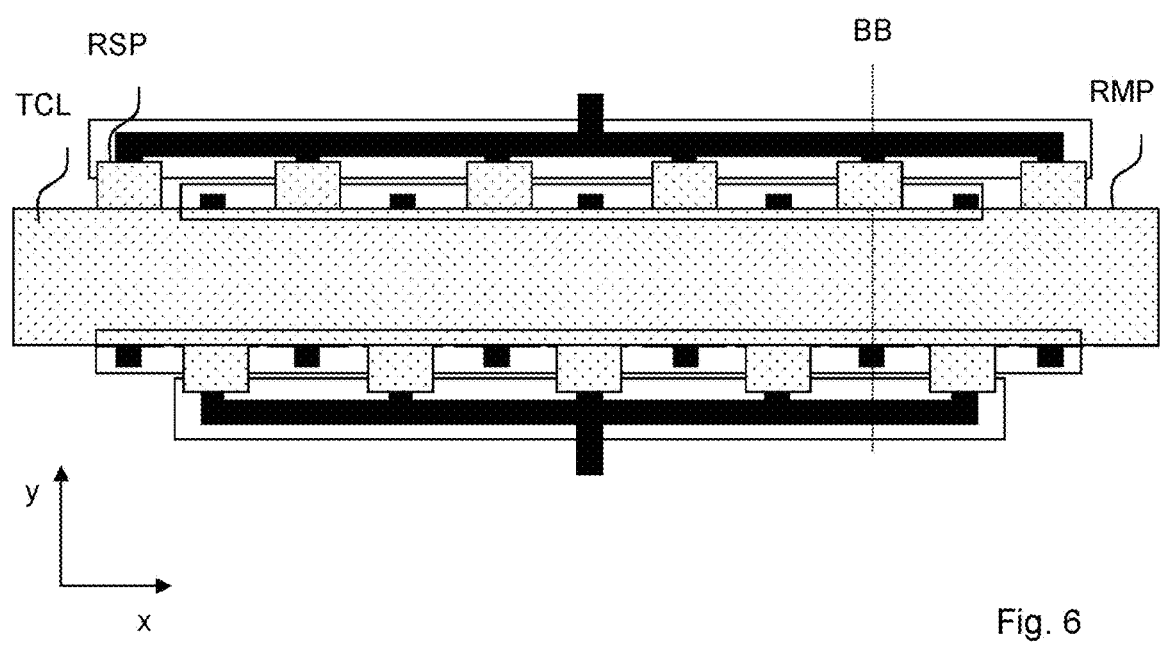
FIG. 6 illustrates the possibility of providing material of a TC layer above the acoustic track, which is also used for line crossings.

FIG. 6 illustrates the possibility of arranging material of a TC layer TCL above the acoustic track. The material of the TC layer can comprise a rectangular main patch RMP and one rectangular smaller patch RSP per IDT. The rectangular smaller patch RSP is additionally taking the role of the DM, IP of FIG. 4 and so enables the conductor crossing without the need for an additional dielectric layer.

Figure 7:
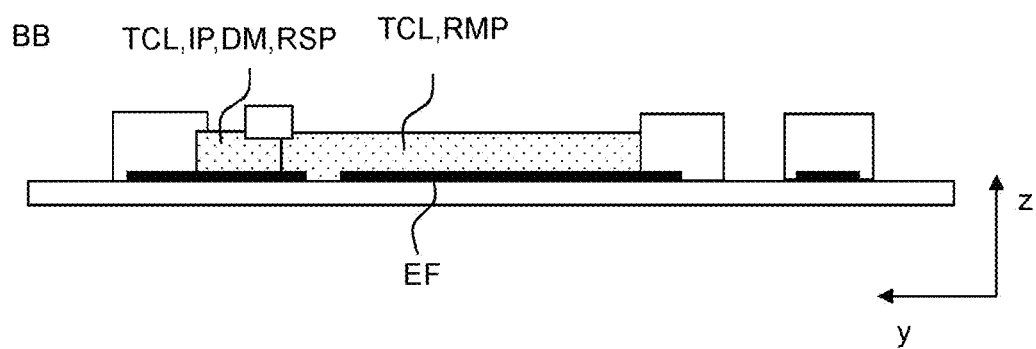
FIG. 7 illustrates a cross-section showing the position of the material of the TC layer.

FIG. 7 illustrates a cross-section of the material system at location BB shown in FIG. 6. The material of the TC layer TCL is arranged above the material of the electrode fingers EF.

FIG. 8 illustrates the layer construction of the electrode structure comprising the first layer L1 in which the electrode fingers can be structured, the second layer L2 which comprises the dielectric material of the insulating patches and advantageously at the same time the TC function and the third layer L3 comprising the upper metal strips and the inner metal strips. The first layer can be directly arranged on the piezoelectric material PM. The piezoelectric material can be arranged on a carrier substrate CS.

However, it is also possible that further material of a TC layer is arranged between the carrier substrate CS and the piezoelectric material and/or between the piezoelectric material PM and the first layer L1 or above the third layer or above the first layer.

FIG. 9a illustrates characteristic distances in the lateral direction y. d1 denotes the distance between the lateral outer position of the busbars of the IDTs and the third inter IDT connection IIC3. d3 denotes the transversal distance between the upper metal strip and the inner metal strip. w2 denotes the width of the inner metal strip. w4 denotes the width of the upper metal strip. o1 denotes the overlap between the upper metal strip and the insulating patches. The insulating patches IP of the dielectric material DM overlap at least partially with the upper metal strip UMS.

FIG. 9b illustrates characteristic distances in the lateral direction y. d1 denotes the distance between the lateral outer position of the bus bars of the IDTs and the third inter IDT connection IIC3. d3 denotes the transversal distance between the upper metal strip and the inner metal strip. w2 denotes the width of the inner metal strip. w4 denotes the width of the upper metal strip. o1 denotes the overlap between the upper metal strip and the insulating patches. The insulating patches IP of the dielectric material DM do not overlap with the lower metal strip LMS of the first inter IDT connection IIC1 but—at least partially—with the upper metal strip UMS.

Compared to the electrode structure shown in FIG. 9a the insulating patches IP of the dielectric material DM have a reduced extension in the transversal direction.

FIG. 10 illustrates a basic circuit topology of a duplexer DU. The duplexer DU comprises a transmission filter TXF and a reception filter RXF. The transmission filter TXF usually is connected between a transmission port and an antenna port connected to an antenna AN. The reception filter RXF is typically connected between a reception port and the antenna port. The transmission filter TXF and the reception filter RXF base on a ladder-type like circuit topology having a signal path with series resonators SR electrically connected in series between an input port and an output port. Further, parallel paths comprise parallel resonators PR electrically connecting the signal path to a ground potential.

In order to match the frequency-dependent impedances of the reception filter RXF, the transmission filter TXF and/or the antenna, an impedance matching circuit IMC can be connected between the transmission filter TXF and the reception filter RXF, e.g. at the antenna port.

Between the ladder-type like circuit topology of the reception filter RXF and the filters output port a DMS filter DMSF is arranged and electrically connected.

For the reception filter RXF the ladder-type like topology provides good power durability and the DMS Filter DMSF enhances the insulation and selection levels while reducing chip space requirements.

LIST OF REFERENCE SIGNS

AN: antenna
B1, B2: first, second busbar of an IDT
C1, C2: first, second connection of an IDT
CS: carrier substrate d1, d3: distances
DM: dielectric material
DMSF: DMS filter
DU: duplexer
EF: electrode finger
ES: electrode structure
IDT: interdigital transducer
IDT1 first IDT
IDT2: second interdigital transducer
IIC1, IIC2: first, second inter IDT connection
IIC3, IIC4: third, fourth inter IDT connection
IMC: impedance matching circuit
IMP: inner metal strip
IP: insulating patch
L1, L2, L3: first, second, third layer
LMS: lower metal strip
R1: first acoustic reflector
R2: second acoustic reflector
MLC: multilayer construction
o1, o2: overlap widths
P1: first port
P2: second port
PM: piezoelectric material
PR: parallel resonator
RMP: rectangular major patch
RSP: rectangular small patch
RXF: reception filter
SL: symmetry line
SR: series resonator
TCL: TC layer (Temperature Compensation)
TXF: transmission filter
UMS: upper metal strip
w2, w4: strip widths
x: direction of propagation of the SAW
y: transversal direction
z: vertical direction

The invention claimed is:

1. A DMS filter, comprising:
a first port and a second port;
a piezoelectric material; and
an electrode structure arranged above or on the piezoelectric material and electrically connected between the first port and the second port, wherein:
the electrode structure has a multi layer construction,
the multi layer construction comprises metal and dielectric material, the electrode structure comprising:
  a first reflector and a second reflector;
  first IDTs and second IDTs, wherein the first IDTs and the second IDTs are arranged between the first and the second reflectors; and
  a first inter IDT connection and a second inter IDT connection, wherein:
    each of the first IDTs and each of the second IDTs have a first busbar and a first connection and a second busbar and a second connection,
    the first busbar and the first connection of each of the first IDTs are electrically connected via the first inter IDT connection,
    the second busbar and the second connection of each of the second IDTs are electrically connected via the second inter IDT connection, and
    wherein the first inter IDT connection and the second inter IDT connection each comprise a lower metal strip and an upper metal strip.

2. The DMS filter of claim 1, wherein the electrode structure further comprises:
a third inter IDT connection and a fourth inter IDT connection,
wherein each of the third inter IDT connection and the fourth inter IDT connection comprises an inner metal strip.

3. The DMS filter of claim 2, wherein the dielectric material of the electrode structure comprises:
first insulating patches between the third inter IDT connection and the first connection of at least a portion of the first IDTs; and
second insulating patches between the fourth inter IDT connection and the second connection of at least a portion of the second IDTs.

4. The DMS filter of claim 1, wherein:
the lower metal strip of each of the first inter IDT connection and of the second inter IDT connection is formed from a first layer,
the upper metal strip of each of the first inter IDT connection and of the second inter IDT connection is formed from a third layer, and
the dielectric material of the multi layer construction comprises insulating patches in a second layer between the first layer and the third layer.

5. The DMS filter of claim 4, wherein the third layer has a higher thickness than the first layer.

6. The DMS filter of claim 4, wherein the upper metal strip of the first inter IDT connection overlaps the insulating patches.

7. The DMS filter of claim 2, wherein the third inter IDT connection and the fourth inter IDT connection are connected to a ground potential.

8. The DMS filter of claim 1, wherein the first IDTs are input IDTs and the second IDTs are output IDTs.

9. The DMS filter of claim 1, further comprising a TC layer.

10. The DMS filter of claim 9, where the TC layer is configured as an insulator for line crossings.

11. The DMS filter of claim 1, being a TF-SAW DMS filter.

12. The DMS filter of claim 4, wherein the upper metal strip of the second inter IDT connection (IIC2) overlaps the insulating patches.

13. The DMS filter of claim 3, wherein the inner metal strip of the third inter IDT connection is located on top of the first insulating patches.

14. The DMS filter of claim 4, wherein:
the upper metal strip of the first inter IDT connection fully covers the lower metal strip of the first inter IDT connection.

15. The DMS filter of claim 14, wherein the insulating patches do not overlap the lower metal strip.

16. The DMS filter of claim 4, wherein the upper metal strip of the second inter IDT connection fully covers the lower metal strip of the second inter IDT connection.

17. The DMS filter of claim 1, wherein the dielectric material of the multi layer construction comprises insulating patches that overlap the first connection of at least a portion of the first IDTs and the second connection of at least a portion of the second IDTs.

18. The DMS filter of claim 17, wherein the insulating patches do not overlap the first busbar of each of the first IDTs.

19. The DMS filter of claim 1, wherein the DMS filter is included as part of an electroacoustic filter, the DMS filter being an 11-IDT DMS filter.

20. The DMS filter of claim 1, wherein the DMS filter is included as part of a multiplexer.

21. The DMS filter of claim 3, wherein the inner metal strip of the fourth inter IDT connection is located on top of the second insulating patches.

22. A DMS filter, comprising:
a first port and a second port;
a piezoelectric material; and
an electrode structure arranged above or on the piezoelectric material and electrically connected between the first port and the second port, wherein:
the electrode structure has a multi layer construction,
the multi layer construction comprises metal and dielectric material, the electrode structure comprising:
a first reflector and a second reflector;
first IDTs and second IDTs, wherein the first IDTs and the second IDTs are arranged between the first and the second reflectors; and
a first inter IDT connection and a second inter IDT connection, wherein:
each of the first IDTs and each of the second IDTs have a first busbar and a first connection and a second busbar and a second connection,
the first busbar and the first connection of each of the first IDTs are electrically connected via the first inter IDT connection,
the second busbar and the second connection of each of the second IDTs are electrically connected via the second inter IDT connection, and
wherein the dielectric material of the multi layer construction comprises insulating patches that overlap the first connection of each of the first IDTs and the second connection of each of the second IDTs.

23. A DMS filter, comprising:
a first port and a second port;
a piezoelectric material; and
an electrode structure arranged above or on the piezoelectric material and electrically connected between the first port and the second port, wherein:
the electrode structure has a multi layer construction,
the multi layer construction comprises metal and dielectric material, the electrode structure comprising:
a first reflector and a second reflector;
first IDTs and second IDTs, wherein the first IDTs and the second IDTs are arranged between the first and the second reflectors;
a first inter IDT connection and a second inter IDT connection; and
a third inter IDT connection and fourth inter IDT connection, wherein:
each of the first IDTs and each of the second IDTs have a first busbar and a first connection and a second busbar and a second connection,
the first busbar and the first connection of each of the first IDTs are electrically connected via the first inter IDT connection,
the second busbar and the second connection of each of the second IDTs are electrically connected via the second inter IDT connection, and
each of the third inter IDT connection and the fourth inter IDT connection comprises an inner metal strip.

* * * * *